United States Patent
Mazumder et al.

(10) Patent No.: US 10,878,932 B2
(45) Date of Patent: Dec. 29, 2020

(54) APPARATUSES AND METHODS INCLUDING NESTED MODE REGISTERS

(71) Applicant: Micron Technology, Inc., Boise, ID (US)

(72) Inventors: Kallol Mazumder, Plano, TX (US); William O'Leary, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/678,691

(22) Filed: Nov. 8, 2019

(65) Prior Publication Data

US 2020/0073775 A1 Mar. 5, 2020

Related U.S. Application Data

(60) Continuation of application No. 16/033,076, filed on Jul. 11, 2018, now Pat. No. 10,489,260, which is a division of application No. 15/215,423, filed on Jul. 20, 2016, now Pat. No. 10,043,587.

(51) Int. Cl.

| G11C 29/16 | (2006.01) |
|---|---|
| G11C 29/00 | (2006.01) |
| H03K 19/173 | (2006.01) |
| G11C 8/10 | (2006.01) |
| G11C 7/22 | (2006.01) |
| G11C 8/08 | (2006.01) |
| G06F 11/267 | (2006.01) |
| G11C 7/10 | (2006.01) |
| G11C 8/06 | (2006.01) |
| G11C 29/46 | (2006.01) |

(52) U.S. Cl.
CPC ............ *G11C 29/16* (2013.01); *G06F 11/267* (2013.01); *G11C 7/109* (2013.01); *G11C 7/1045* (2013.01); *G11C 7/22* (2013.01); *G11C 8/08* (2013.01); *G11C 8/10* (2013.01); *G11C 29/00* (2013.01); *H03K 19/1737* (2013.01); *G11C 8/06* (2013.01); *G11C 29/46* (2013.01)

(58) Field of Classification Search
CPC ......... G06F 11/267; G11C 8/04; G11C 29/16; G11C 8/08; G11C 8/10; G11C 8/06; G11C 7/1006; G11C 7/22
See application file for complete search history.

(56) References Cited

U.S. PATENT DOCUMENTS

| 5,301,285 A | 4/1994 | Hanawa et al. |
|---|---|---|
| 5,437,043 A | 7/1995 | Fujii et al. |
| 10,043,587 B2 | 8/2018 | Mazumder et al. |
| 2012/0204069 A1 | 8/2012 | Hughes |
| 2014/0043918 A1 | 2/2014 | Ellis et al. |
| 2018/0025760 A1 | 1/2018 | Mazumder et al. |
| 2018/0322937 A1 | 11/2018 | Mazumder et al. |

*Primary Examiner* — Ajay Ojha
(74) *Attorney, Agent, or Firm* — Dorsey & Whitney LLP

(57) ABSTRACT

Apparatuses and methods for nested mode registers to extend mode register functionality are disclosed. An example apparatus comprises a mode register configured to store address information and write data, a plurality of nested mode registers coupled to the mode register and configured to store the write data, and a decoder circuit coupled to the mode register and the plurality of nested mode registers and configured to selectively enable a nested mode register of the plurality of nested mode registers to store the write data based, at least in part, on the address information.

17 Claims, 5 Drawing Sheets

APPARATUSES AND METHODS INCLUDING NESTED MODE REGISTERS

CROSS-REFERENCE TO RELATED APPLICATION(S)

This application is a continuation of U.S. patent application Ser. No. 16/033,076 filed Jul. 11, 2018, and issued as U.S. Pat. No. 10,489,260 on Nov. 26, 2019, which is a divisional of U.S. patent application Ser. No. 15/215,423 filed Jul. 20, 2016, and issued as U.S. Pat. No. 10,043,587 on Aug. 7, 2018. The afore-mentioned applications and patent are incorporated by reference herein, in their entirety, and for any purposes.

BACKGROUND

Traditional memories include a number of mode registers that may be programmed through a mode register set command and typically define various controls and settings for the memory device. The number and function of the various mode registers are typically defined by a standard, such as the double data rate 4 (DDR4) standard. Mode registers are typically configured to store a limited number of bits (e.g., 14 bits) that, when read by the memory device, convey control and setting information for performing memory operations.

Access to mode registers in these devices is typically a write only operation where the source of information stored in the mode register comes from the address bus instead of the device data pins, which require an extensive tuning/calibration process involving the same mode registers to function effectively. Many such devices, such as those compliant with the DDR4 standard, include a way to indirectly read back a subset of the contents of some predefined mode registers using the Multipurpose Register function (which is itself enabled/disabled by Mode Register Settings). However, previous standards had no method to read back the data stored in the Mode Registers.

DETAILED DESCRIPTION

Certain details are set forth below to provide a sufficient understanding of embodiments of the invention. However it will be clear to one skilled in the art, that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Embodiments of the present invention recognize that many memory devices, such as those designed in accordance with the DDR4 or low power DDR4 (LPDDR4) standards, have a predefined number of available mode registers. It may be desirable to implement additional mode registers without departing from the specifications of the provided standard in order to take advantage of both additional functionality and standard compliance. Many standards, including DDR4 and LPDDR4, require a three bit bank address for writing to mode registers. The three bit bank address allows for up to eight different mode registers. Many standards specifically define the function of several mode registers that must be complied with. In the case of DDR4 and LPDDR4, seven mode registers are defined in the standard, leaving one mode register undefined. Embodiments disclosed herein address the above challenges and more by describing a nested mode register architecture that is accessible using the standard DDR4/LPDDR4 command protocol.

Figure 1:
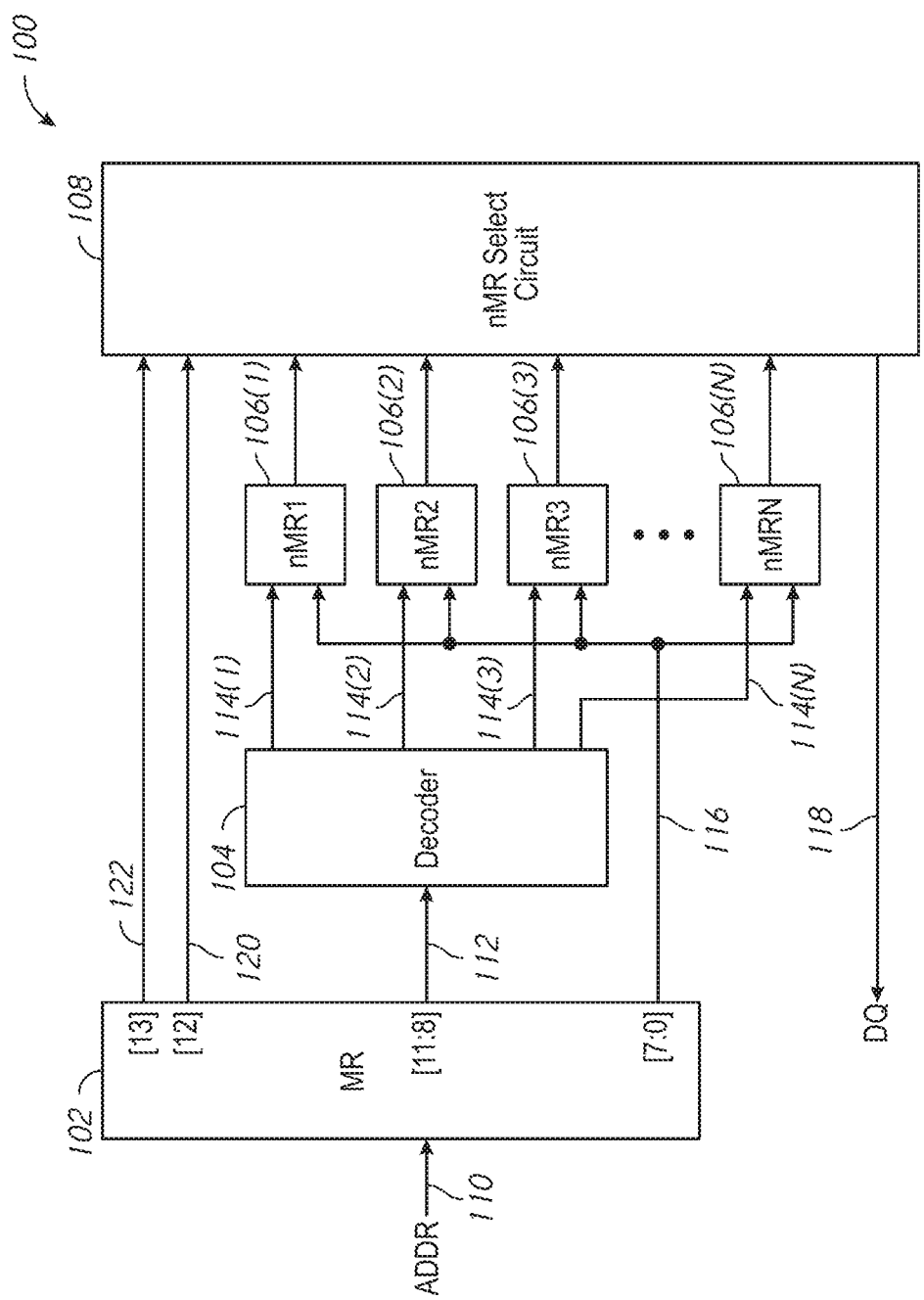
FIG. 1 is a block diagram of a mode register circuit, in accordance with an embodiment of the present invention.

FIG. 1 is a block diagram of a mode register circuit, generally designated 100, in accordance with an embodiment of the present invention. The mode register circuit generally includes a first mode register 102, a decoder circuit 104, a plurality of second mode registers 106(1)-(N), and a mode register select circuit 108.

The first mode register 102 may generally be any type of register that stores a set of mode register bits or mode register set fields. The first mode register 102 may be one of a plurality of mode registers and may be selected based on a bank address. The set of mode register bits of the first mode register 102 may be written to by, for example, a mode register set command. Mode register data may be provided to the first mode register 102 via an address bus 110 as is common in DDR4 and LPDDR4 compliant memory devices. As discussed above, the first mode register 102 may represent just one of a number of mode registers that are programmable through the address bus 110. For example, in embodiments compliant with the DDR4 or LPDDR4 standard, the first mode register 102 may be the eighth defined mode register, where the other seven mode registers are defined in compliance with the relevant standard.

The first mode register 102 may generally have any number of addressable mode register bits. For example, in the embodiment of FIG. 1, the first mode register 102 includes a set of 14 mode register bits (e.g., [13:0]) that may be written to using the address bus 110. For example, during a mode register set command, mode register set data may be provided to the first mode register 102 via the address bus 110. The mode register set data may include various types of information, such as mode register data to be stored in one or more of the second mode registers 106(1)-(N), address information to identify one or more of the second mode registers 106(1)-(N), information related to selecting a subset of second mode registers 106(1)-(N) from which to provide mode register data, and information indicative of whether to provide mode register data from second mode registers 106(1)-(N) or MPR data. The set of mode register bits may be grouped together into a number of subsets, where each subset serves a different purpose. For example, mode register bits [7:0] may be a subset of the set of mode register bits configured to be written to with mode register data. The mode register data may then be written to one or more second mode registers (e.g., second mode registers 106(1)-(N)). Mode register bits [11:8] may be a subset of mode register bits configured to store mode register address information for identifying the one or more second mode registers 106(1)-(N) to which the mode register data is to be written. Mode register address information may be written to the mode register bits [11:8] responsive to a mode register set command. Mode register bit [12] may be a subset of the set of mode register bits configured to store mode register selection information for selecting a subset of second mode registers 106(1)-(N). The selected subset of second mode registers 106(1)-(N) provides the respective mode register data responsive to the nested mode register circuit 100. Mode register bit [13] may be a subset of the set of mode register bits configured to store mode register set data indicative of whether MPR data or mode register data from a subset of the second mode registers 106(1)-(N) should be provided on the data bus 118 responsive to a read command. When the mode register data bit [13] is set to a first value (e.g., logical low), standard MPR data may be provided on the data bus 118 responsive to a read command. When the mode register data bit [13] is set to a second value (e.g., logical high), mode register data from a subset of the second mode registers 106(1)-(N) may be provided on the data bus 118 responsive to a read command.

Those skilled in the art will appreciate that the particular mode register bit assignments are merely an example, and that alternative mode register bit assignments may be implemented without departing from the scope of this application. Additionally, different numbers of bits may be assigned to the different subsets of bits. For example, three mode register bits may be defined to store the mode register address information instead of the four mode register bits as described above.

The decoder circuit 104 may be a circuit configured to receive mode register address information via a mode register address bus 112, identify one or more of the second mode registers 106(1)-(N) based on the mode register address information, and selectively enable the identified one or more second mode registers 106(1)-(N) to be written with mode register data based on the address information. The decoder circuit 104 may include, for example, a multiplexer configured to receive the mode register address information and to provide an enable signal to one or more of the second mode registers 106(1)-(N) via respective mode register enable lines 114(1)-(N). For example, the decoder circuit may receive mode register address information '0001' (corresponding to second mode register 106(2)) which is stored in mode register bits [11:8] of the first mode register 102 via the mode register address bus 112, and provide an active enable signal to the second mode register 106(2) via the mode register enable line 114(2). The remaining second mode registers 106(1) and 106(3)-106(N) may be provided inactive enable signals over mode register enable lines 114(1) and 114(3)-(N) respectively. The activated mode register (e.g., second mode register 106(2)) may store the mode register data stored in mode register bits [7:0] of the first mode register 102 and provided on a mode register data bus 116.

The second mode registers 106(1)-(N) may generally be any type of register that are configured to store a number of bits. The second mode registers 106(1)-(N) may be considered "nested" within the first mode register 102 because they all may be accessed (e.g., written to) through a single first mode register 102 defined for the purpose of accessing the second mode registers 106(1)-(N). Accordingly, the second mode registers 106(1)-(N) are "nested" within the first mode register 102. In various embodiments, the second mode registers 106(1)-(N) may be configured to store eight bits each. The second mode registers 106(1)-(N) may each be coupled to the first mode register 102 by the mode register data bus 116. The mode register write data, which is stored in mode register bits [7:0] of the first mode register 102, may be provided to an enabled second mode register 106(1)-(N) via the mode register data bus 116. As discussed above, each of the second mode registers 106(1)-(N) may be addressable by mode register bits [11:8] of the first mode register 102. As previously described, the mode register bits [11:8] may store mode register address information identifying a mode register of the second mode registers 106(1)-(N). In such embodiments, there may be sixteen second mode registers 106(1)-(N) that may be individually selected based on the 4 mode register bits [11:8]. 106(1) The second mode registers 106(1)-(N) may store information associated with the one or more controls or settings for a memory device. For example, the controls or settings may include hidden refresh mode enablement, decryption enablement, status channel control, cache control, cache fetch size, latency programming, and internal clock control, among others.

The mode register select circuit 108 may generally be a circuit configured to select one or more of the second mode registers 106(1)-(N) and to provide mode register data on the data bus 118 for each of the selected second mode registers 106(1)-(N). In various embodiments, the mode register select circuit 108 may be configured to selectively provide mode register data stored on half of the second mode registers 106(1)-(N) at a time. The mode register data stored in the second mode registers 106(1)-(N) may be provided responsive to setting the mode register bit [13] of the first mode register 102 to a particular logical value (e.g., logical high). The first mode register 102 may be coupled to the mode register select circuit 108 via select signal lines 120 and 122, which provide the values stored in mode register bits [12] and [13] to the mode register select circuit 108, respectively, in the form of first and second select signals, respectively. As discussed above, the value stored in mode register bit [12] may be indicative of a subset of the second mode registers 106(1)-(N) to be provided on the data bus 118. The value stored in mode register bit [13] may be indicative of the mode register circuit 100 being set to provide mode register data stored on the subset of second mode registers 106(1)-(N) indicated by the value stored in data bit [12]. The select circuit is described in further detail below with respect to FIG. 3.

Figure 2:
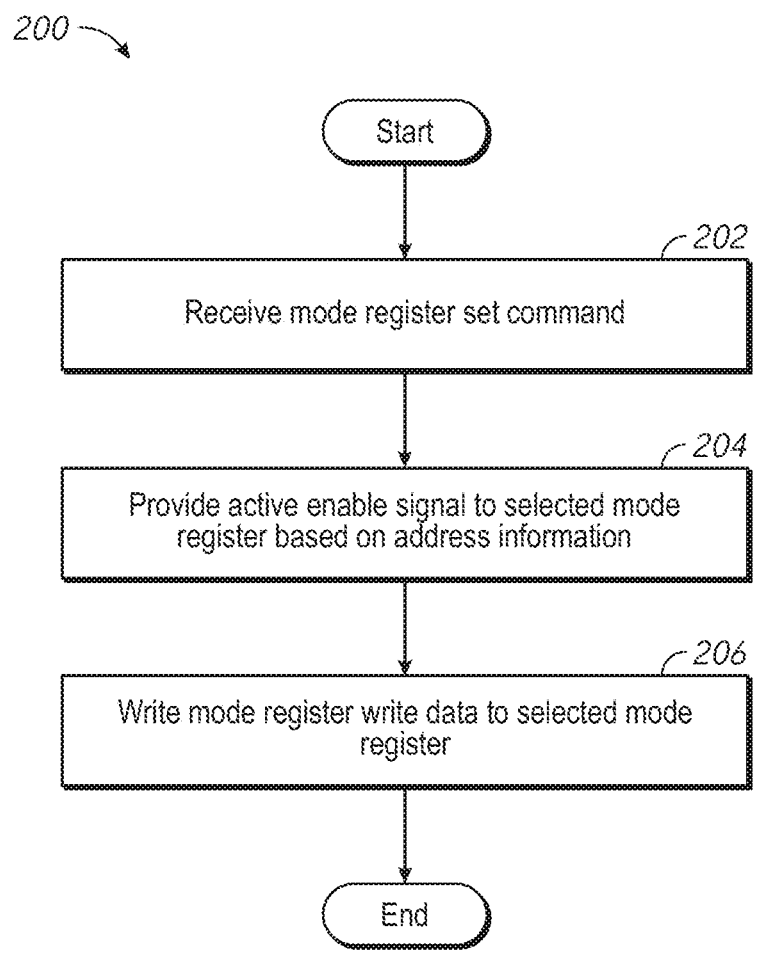
FIG. 2 is a flowchart illustrating a mode register write operation in accordance with the embodiment of FIG. 1.

FIG. 2 is a flowchart illustrating operations for storing mode register data in one or more of the second mode registers, in accordance with the embodiment of FIG. 1. In operation 202, the mode register circuit 100 receives a mode register set command. Mode register data may be provided to the first mode register 102 via the address bus 110 in conjunction with the mode register set command. As described above with respect to FIG. 1, the mode register set data may include a variety of information, including mode register data to be stored in one or more of the second mode registers 106(1)-(N) and address information identifying one or more of the second mode registers 106(1)-(N).

Based on the address information provided in the mode register set data, the mode register circuit 100 provides an active enable signal to a selected second mode register 106 in operation 204. As discussed above, a subset of the mode register bits [13:0] (e.g., mode register bits [11:8]) may be written with mode register address information indicative of which of the second mode registers 106(1)-(N) is to be written with the mode register write data. Based on the mode register address information, the mode register circuit 100 may identify the selected second mode registers 106(1)-(N) by decoding the address information with the decoder circuit 104 and provide an active enable signal to the selected second mode registers 106(1)-(N) while providing an inactive enable signal to the remaining second mode registers 106(1)-(N). In operation 206, the mode register circuit 100 writes the mode register write data to the selected second mode registers 106(1)-(N). For example, mode register write data may be received with the mode register data and stored in a subset of the mode register bits [13:0] (e.g., mode register bits [7:0]). Responsive to the active enable signal, the mode register write data may be written to the mode register bits of the selected second mode registers 106(1)-(N).

Figure 3:
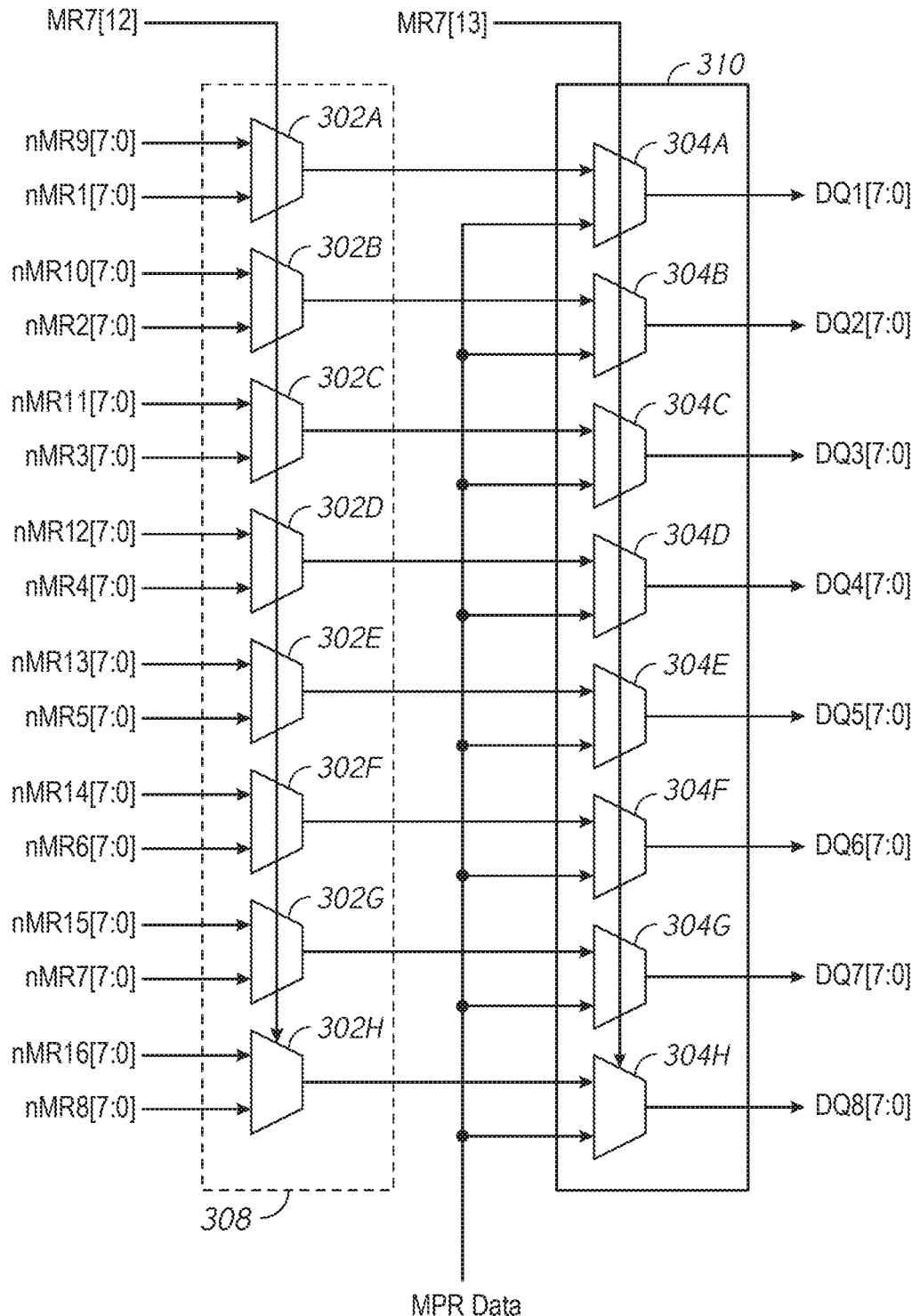
FIG. 3 is a schematic diagram of a mode register select circuit and a modified MPR circuit, in accordance with an embodiment of the present invention.

FIG. 3 is a schematic diagram of a mode register select circuit, generally designated 308, and a modified MPR circuit, generally designated 310 in accordance with an embodiment of the present invention. In various embodiments, the mode register select circuit 308 may be implemented as the mode register select circuit 108 of FIG. 1. In general, the mode register select circuit 308 and the modified MPR circuit 310 may provide mode register data stored in a subset of the second mode registers 106(1)-(N) on the data bus 118 responsive to a read command.

The mode register select circuit 308 generally includes a first plurality of multiplexers 302A-H. The modified MPR circuit 310 generally includes a second plurality of multiplexers 304A-H. Each of the multiplexers in the first plurality of multiplexers 302A-H may be coupled to a pair of the second mode registers 106(1)-(N). For example, in an embodiment with 16 mode registers (designated second mode registers 106(1)-(16)), the multiplexer 302A may be coupled to second mode registers 106(1) and 106(9), the multiplexer 302B may be coupled to second mode registers 106(2) and 106(10), and so on. Each multiplexer of first plurality of multiplexers 302A-N may have a select input coupled to the first mode register 102 and configured to receive a signal based on the value stored in mode register bit [12] of the first mode register 102. As discussed above, the value stored in mode register bit [12] may be set in order to select a subset of the second mode registers 106(1)-(N) to read. For example, if mode register bit [12] is set to a first value (e.g., logically high), then a first subset of the second mode registers 106(1)-(N) may be read. If mode register bit [12] is set to a second value (e.g., logically low), then a second subset of the second mode registers 106(1)-(N) may be read. In the embodiment of FIG. 2, if mode register bit [12] is set to a first value, then the selected subset includes second mode registers 106(1)-(8), and if mode register bit [12] is set to a second value, the selected subset includes nested second mode registers 106(9)-(16). The bits stored in the selected subset of nested second mode registers 106(1)-(N) may be provided to respective output terminals of the first plurality of multiplexers 302A-H.

The output terminal of each multiplexer of the first plurality of multiplexers 302A-H may be coupled to a first input terminal of a corresponding multiplexer of the second plurality of multiplexers 304A-H. For example, the output terminal of the multiplexer 302A may be coupled to a first input terminal of the multiplexer 304A. In some embodiments, the second input terminals of the second plurality of multiplexers 304A-H may be configured to provide multipurpose register (MPR) read data as the standard read data. The particular contents of the MPR read data may be defined in a standard specification, such as the DDR4 standard. For example, the standard read data may include a string of logically low values or logically high values.

Each multiplexer of the second plurality of multiplexers 304A-H may have a select input terminal that is coupled to mode register bit [13] of the first mode register 102. Based on a first value being stored in bit [13], the second plurality of multiplexers 304A-H may be configured to provide the standard read data. Alternatively, when mode register bit [13] is set to a second value, the second plurality of multiplexers 304A-H may be configured to provide the data received from the first plurality of multiplexers 302A-H. The output of the second plurality of multiplexers 304A-H may be provided serially on the data bus 118, which may be an 64-bit wide bus. For example, the output of the multiplexer 304A may be provided on DQ1, the output of the multiplexer 304B may be provided on DQ2, etc. The data may be provided, for example, as an eight bit burst for each of the selected second mode registers 106. That is, the eight bits stored in the second mode register 106(1) may be provided as an eight bit burst on DQ1, the eight bits stored in the second mode register 106(2) may be provided as an eight bit burst on DQ2 of the 64-bit wide data bus 118, and so on. By setting mode register bit [13] to the second value, and setting mode register bit [12] to indicate a particular subset of second mode registers 106(1)-(N) to be read, the mode register select circuit 108 may provide the contents of the selected subset of the second mode registers 106(1)-(N) on the data bus 118. Those skilled in the art will appreciate that the particular implementation shown in FIG. 4 is intended only to be an example and that in various embodiments; other implementations may be possible without departing from the scope of the present invention.

Figure 4:
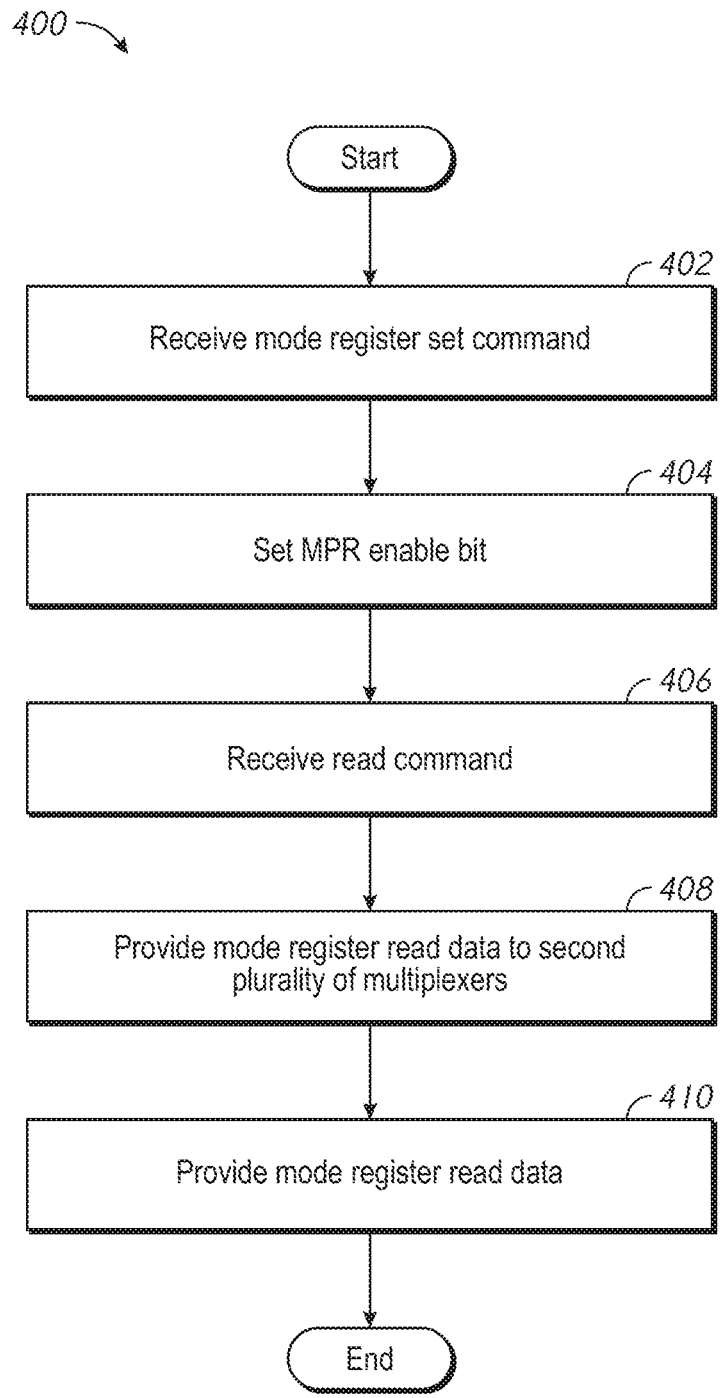
FIG. 4 is a flowchart illustrating a mode register read operation, in accordance with the embodiment of FIG. 3.

FIG. 4 is a flowchart, generally designated 400, illustrating operational steps for returning data from one or more of the second mode registers 106(1)-(N), in accordance with the embodiments of FIGS. 1 and 3. In operation 402, the mode register circuit 100 receives a mode register set command. In various embodiments, mode register set data may be stored at least in mode register bits [12] and [13]. In operation 404, an MPR data bit is set. In various embodiments, the memory device 104 may have a programmable mode register that, when set to a particular value, causes the memory device to return MPR data on the data bus 118. The MPR enable bit may be located in a mode register other than the first mode register 102. In operation 406, the mode register circuit 100 receives a read command. Responsive to the read command, the mode register circuit 100 may provide data on the data bus 118. What data is returned depends on the values stored in bits [12] and [13] in operation 402. For example, mode register bit [12] may store a value indicative of a subset of the second mode registers 106(1)-(N) to read. As shown in FIG. 3, the value stored in mode register bit [12] may be provided to a select input of the first plurality of multiplexers 302A-H of the mode register select circuit 308. Based on the value of mode register bit [12], a first or second subset of the mode registers is selected to be read by the first plurality of multiplexers 302A-H. In operation 406, the mode register select circuit 308 provides data from the selected subset of second mode registers 106(1)-(N) to the second plurality of multiplexers 304. In operation 408, the mode register circuit 100 may provide the mode register read data from the selected subset of the second mode registers 106(1)-(N) on the data bus 118. The value of mode register bit [13] may be provided to the select input of the second plurality of multiplexers 304A-H of the modified MPR circuit 310. The value stored in bit [13] may be indicative of what information to provide on the data bus 118. For example, if bit [13] is logically low, then standard MPR data may be provided on the data bus 118. Alternatively, if bit [13] is logically high, then the mode register data received from the mode register select circuit 310 may be provided on the data bus 118. For example, the mode register read data may be provided serially on a 64-bit wide data bus 118 in eight 8-bit bursts as described above with respect to FIG. 3.

Figure 5:
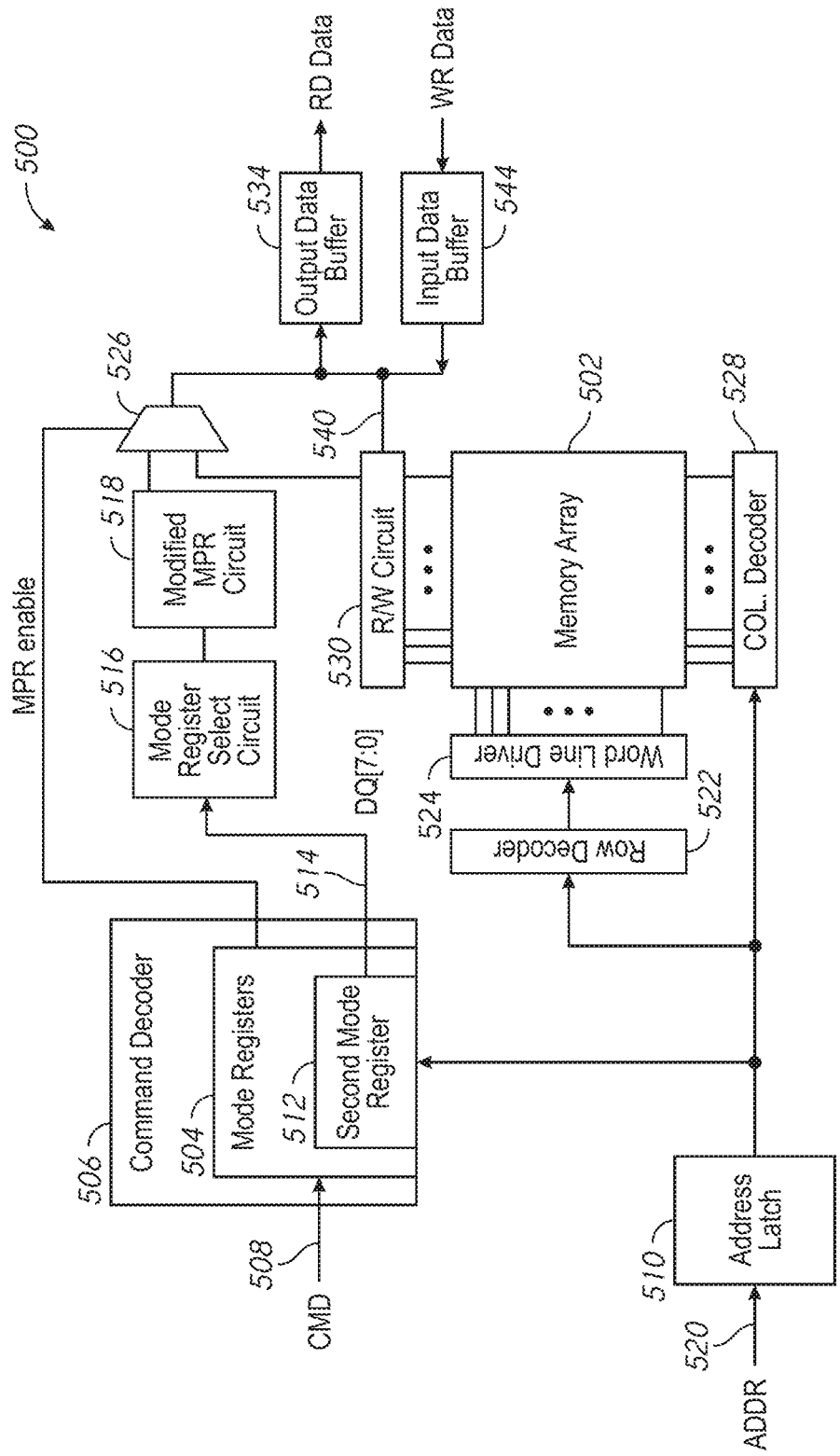
FIG. 5 is a block diagram of a memory including a mode register circuit, in accordance with an embodiment of the present invention.

FIG. 5 is a block diagram of a memory 500, in accordance with an embodiment of the invention. The memory 500 may include an array 502 of memory cells, which may be, for example, volatile memory cells (e.g., dynamic random-access memory (DRAM) memory cells, static random-access memory (SRAM) memory cells), non-volatile memory cells (e.g., flash memory cells), or some other types of memory cells. The memory 500 includes a command decoder 506 that may receive memory commands through a command bus 508 and provide (e.g., generate) corresponding control signals within the memory 500 to carry out various memory operations. For example, the command decoder 506 may respond to memory commands provided to the command bus 508 to perform various operations on the memory array 502. In particular, the command decoder 506 may be used to provide internal control signals to read data from and write data to the memory array 502. Row and column address signals may be provided (e.g., applied) to an address latch 510 in the memory 500 through the address bus 520. The address latch 510 may then provide (e.g., output) address information to row decoder 522 and column decoder 528. In various embodiments, the address bus 520 and the command bus 508 may be implemented as a single command/address bus.

The command decoder 506 may include mode registers 504, which may provide access to one or more second registers 512 that may be written to using a mode register set command received on the command/address bus 508, as described above with respect to FIGS. 1-2. The second mode registers 512 may be implemented as the first mode register 102 of FIG. 1, such that the mode register circuit 512 is accessible by programming a particular mode register of the mode registers 504. Data from the mode register circuit 512 may be provided, for example, to various components, circuits, and/or blocks (not shown) for implementing various functionality in the memory 500. Mode register data stored in the second mode registers 512 may be provided to the output data buffer 534 to be provided as read data (RD data). For example, mode register data may be provided to the mode register select circuit 516 which selects a subset of the second mode registers 512 based on the value stored in mode register bit [12], as described above with respect to FIG. 3. Mode register data from the selected subset is provided to the modified MPR circuit 518, which provides one of the mode register data from the selected subset of second mode registers 512 or standard MPR data. The output of the modified MPR circuit 518 may be provided to a multiplexer 526 which is configured to provide one of the output of the modified MPR circuit 518 and read data from the memory array 502 via the R/W Circuit 530 to the output data buffer 534 responsive to the value stored in the MPR enable bit of one of the mode registers 508, as described above with respect to FIG. 4. In various embodiments, when the MPR enable bit is set to an active value, the multiplexer 526 may be configured to provide data from the modified MPR circuit 518 to the output data buffer 534. Alternatively, when the MPR enable bit is set to an inactive value, the multiplexer 526 may be configured to provide read data from the R/W circuit 530.

The address latch 510 may provide row and column addresses to a row address decoder 522 and a column address decoder 528, respectively. The column address decoder 528 may select bit lines extending through the array 502 corresponding to respective column addresses. The row address decoder 522 may be connected to a word line driver 524 that activates respective rows of memory cells in the array 502 corresponding to received row addresses. The selected data line (e.g., a bit line or bit lines) corresponding to a received column address may be coupled to a read/write circuitry 530 to provide read data to an output data buffer 534 via an input-output data path 540. Write data may be provided to the memory array 502 through an input data buffer 544 and the memory array read/write circuitry 530.

Those of ordinary skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Skilled artisans may implement the described functionality in varying ways for each particular application, but such implementation decisions should not be interpreted as causing a departure from the scope of the present disclosure.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as previously described.

What is claimed is:

1. An apparatus, comprising:
   a first plurality of mode registers configured to be accessed in compliance with a standard;
   a second plurality of mode registers configured to store mode register data associated with one or more controls or settings for a memory device;
   a mode register configured to store information for accessing the second plurality of mode registers and mode register data; and
   a decoder circuit, wherein the mode register is further configured to provide the information for accessing the second plurality of mode registers to the decoder circuit and provide the mode register data to the second plurality of mode registers.

2. The apparatus of claim 1 wherein the mode register is configured to be accessed in compliance with the standard.

3. The apparatus of claim 1 wherein the second plurality of mode registers are configured to store mode register data associated with controls or setting for a memory device including one or more of a hidden refresh mode, decryption, status channel control, cache control, cache fetch size, latency programming, and internal clock control.

4. The apparatus of claim 1 wherein the mode register is configured to store information for accessing the second plurality of mode registers including one or more of mode register write data, mode register address, and selection information.

5. The apparatus of claim 1 wherein the first plurality of mode registers includes seven mode registers.

6. The apparatus of claim 1 wherein the first plurality of mode registers and the mode register are accessible via a three bit bank address.

7. The apparatus of claim 1 wherein the first plurality of mode registers and the mode register are configured to be accessed in compliance with a DDR4 or LPDDR4 standard.

8. The apparatus of claim 1, further comprising a select circuit configured to receive mode register data from the second plurality of mode registers and configured to select one or more of the second plurality of mode registers and provide the mode register data for each of the selected one or more of the second plurality of mode registers.

9. The apparatus of claim 8, further comprising a multipurpose register circuit configured to receive mode register data from the select circuit and to receive mode register data from the first plurality of mode registers, the multipurpose register circuit configured to provide the mode register data from the select circuit or from the first plurality of mode registers to a data bus.

10. An apparatus, comprising:
a first plurality of mode registers configured to be accessed in compliance with a standard;
a second plurality of mode registers configured to store mode register data,
wherein the second plurality of mode registers are accessed through a mode register of the first plurality of mode registers that is undefined by the standard; and
a decoder,
wherein the mode register of the first plurality of mode registers is configured to store and provide a set of mode register data to the plurality of second mode registers and store and provide mode register address information to the decoder.

11. The apparatus of claim 10 wherein the mode register address information comprises mode register bits to select one of the second plurality of mode registers for access.

12. The apparatus of claim 11, wherein the decoder is further configured to identify one or more of the second plurality of mode registers based on the mode register address information and selectively enable the identified one or more of the second plurality of mode registers to be accessed.

13. The apparatus of claim 10 wherein the second plurality of mode registers are nested within the mode register of the first plurality of mode registers that is undefined by the standard.

14. A method, comprising:
providing a mode register set command to store mode register bits to a mode register of a memory in compliance with a standard;
providing the mode register bits to be stored in the mode register of the memory, wherein the mode register bits include mode register write data and mode register address information, wherein the mode register address information corresponds to a nested mode register of the memory to which the mode register write data is to be stored, wherein providing the mode register bits comprises providing a mode register bit to select a portion of the plurality of nested mode registers to provide mode register data to the data bus; and
providing a read command to the memory to provide mode register data on a data bus from at least one of a plurality of nested mode registers, wherein the plurality of nested mode registers includes the nested mode register to which the mode register write data is stored.

15. The method of claim 14 wherein providing the mode register bits comprises providing a mode register bit to select a first half of the plurality of nested mode registers to provide mode register data to the data bus or select a second half of the plurality of nested mode registers to provide mode register data to the data bus.

16. A method, comprising:
providing a mode register set command to store mode register bits to a mode register of a memory in compliance with a standard;
providing the mode register bits to be stored in the mode register of the memory, wherein the mode register bits include mode register write data and mode register address information, wherein the mode register address information corresponds to a nested mode register of the memory to which the mode register write data is to be stored; and
providing a read command to the memory to provide mode register data on a data bus from at least one of a plurality of standard mode registers, wherein providing the mode register bits comprises providing a mode register bit to select the standard mode registers to provide mode register data to the data bus.

17. The method of claim 14 wherein providing the mode register bits to be stored in the mode register of the memory comprises providing the mode register bits via an address bus.

* * * * *